United States Patent [19]

Walz

[11] Patent Number: 5,307,237
[45] Date of Patent: Apr. 26, 1994

[54] INTEGRATED CIRCUIT PACKAGING WITH IMPROVED HEAT TRANSFER AND REDUCED SIGNAL DEGRADATION

[75] Inventor: Dale D. Walz, Colorado Springs, Colo.

[73] Assignee: Hewlett-Packard Company, Palo Alto, Calif.

[21] Appl. No.: 938,064

[22] Filed: Aug. 31, 1992

[51] Int. Cl.⁵ .............................................. H05K 7/20
[52] U.S. Cl. .................................... 361/718; 174/52.4; 174/252; 174/256; 257/664; 333/247; 361/778; 361/792
[58] Field of Search ............................ 333/1, 246, 247; 257/664, 728, 713, 717, 720; 174/52.4, 252, 256, 260, 261, 262, 264, 266; 361/386–388, 400, 403, 405, 408, 410, 414

[56] References Cited

U.S. PATENT DOCUMENTS

| | | | |
|---|---|---|---|
| 4,617,586 | 10/1986 | Cuvilliers et al. | 333/247 |
| 4,768,004 | 8/1988 | Wilson | 333/247 |
| 4,839,717 | 6/1989 | Phy | 257/664 |
| 4,925,024 | 5/1990 | Ellenberger | 206/328 |
| 4,949,163 | 8/1990 | Sudo | 357/80 |
| 4,953,001 | 8/1990 | Kaiser, Jr. | 333/247 |
| 5,057,805 | 10/1991 | Kadowaki | 333/247 |
| 5,083,236 | 1/1992 | Chason | 361/401 |
| 5,184,210 | 2/1993 | Westbrook | 257/664 |

*Primary Examiner*—Gerald P. Tolin
*Attorney, Agent, or Firm*—Augustus W. Winfield

[57] ABSTRACT

An integrated circuit packaging system with an integrated circuit die mounted onto a substrate having a top side ground plane between the integrated circuit and the substrate, a bottom side ground plane and short high frequency connections between the two ground planes. The top side ground plane decreases signal degradation due to reflections by providing high frequency ground access close to the die and by providing a transmission line for bond wires. A grid of conductive vias through the substrate improves thermal conductivity and provides the short high frequency current path for the top side ground plane. The die is separated from the top side ground plane by a dielectric layer which also has a conductive layer next the die to provide a back bias voltage.

6 Claims, 4 Drawing Sheets

INTEGRATED CIRCUIT PACKAGING WITH IMPROVED HEAT TRANSFER AND REDUCED SIGNAL DEGRADATION

FIELD OF INVENTION

This invention relates to microelectronics packaging and more particularly to mechanical, thermal and electrical attachment of a high frequency integrated circuit die to a ceramic substrate.

BACKGROUND OF THE INVENTION

Integrated circuit dice are typically attached to a substrate that provides heat transfer and electrical connections. For high frequency circuits, heat transfer becomes especially important. In addition, for high frequency circuits, signal degradation due to reflections may limit the useful frequency range. Therefore, transmission line geometry becomes especially important.

A common method of electrically connecting the die to the substrate is wire bonding (or tape-automated bonding). Wire bonding consists of attaching wires to bonding pads on the die and to traces on the substrate. Flexible wire bonds provide strain relief to allow for differences in thermal expansion between the die and the substrate.

High frequency signals on an integrated circuit die and on the substrate are typically routed by microstrips or other transmission lines. Bonding wires between a substrate and a die form a discontinuity in the transmission line. This discontinuity causes signal degradation due to reflections.

For high frequency circuits, the substrate is typically a material with good thermal conductivity such as aluminum oxide or other ceramic material. The die is typically back bonded to the ceramic for thermal conduction through the back of the die.

FIGS. 1 and 2 illustrate a typical prior art system. FIG. 1 illustrates a top view of a corner of an integrated circuit wire bonded to traces on a substrate. FIG. 2 illustrates a cross section through the assembly illustrated in FIG. 1. In FIGS. 1 and 2, an integrated circuit 100 is wire bonded to traces (102 and 104) on a substrate 106. Trace 102 represents the top portion of a signal microstrip. A ground plane 112 on the bottom side of the substrate 106 forms the other conductor in the microstrip. Trace 104 represents a ground connection to the integrated circuit 100. A plated via 110 connects the ground trace 104 to the ground plane 112 on the bottom of the substrate. In general, traces leading to the integrated circuit 100 are so crowded that via 110 cannot be placed close to the integrated circuit 100.

For high frequency signals (for example signals in the GigaHertz range), trace 102 and the ground plane 112 comprise an effective transmission line. However, at the wire bond 108, there is a discontinuity in the microstrip geometry. At that point, there is no longer a transmission line. Instead of confined electric field lines between the trace 102 and the ground plane 112 below, there is a longer circuit through the integrated circuit requiring current flow through the plated via 110.

The present invention improves substrate thermal conductivity and reduces signal degradation relative to prior art die mounting methods.

SUMMARY OF THE INVENTION

The present invention improves heat conductivity by providing a grid of metal coated or metal filled vias through a ceramic substrate to a heat conductive backplane. The vias are isolated from the integrated circuit die by a dielectric layer. A metallic layer on the die side of the dielectric provides a back bias conductor for the integrated circuit die. A metallic layer on the substrate side of the dielectric, electrically connected to the grid of vias, minimizes signal degradation from transmission line discontinuities due to bonding wires by providing an additional span of microstrip and by minimizing the distance between die pads and electrical ground.

DETAILED DESCRIPTION OF THE PREFERRED EMBODIMENT OF THE INVENTION

Figure 3:
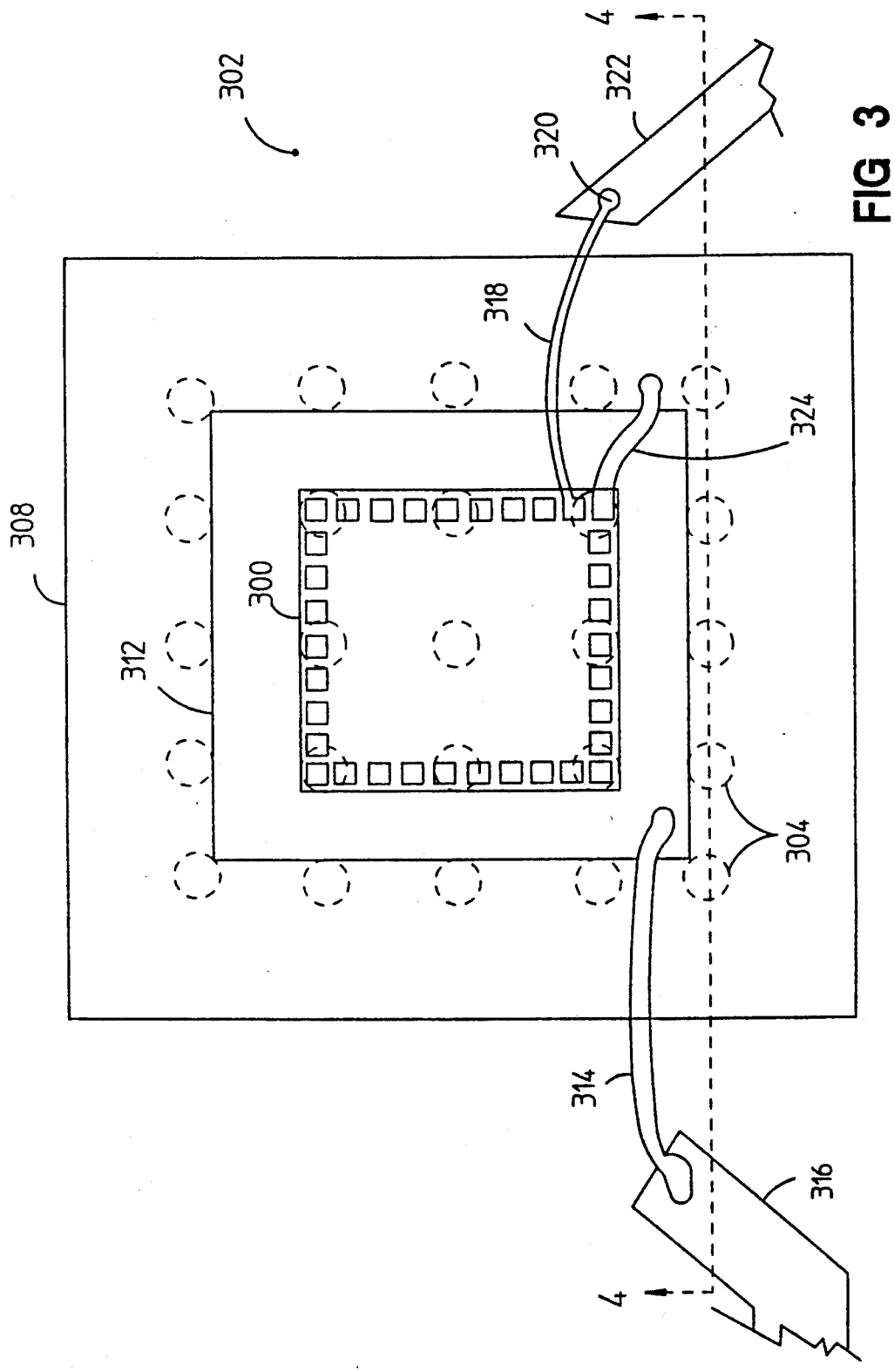
FIG. 3 is a mechanical top view of an integrated circuit mounting and interconnection system in accordance with the present invention.
Figure 4:
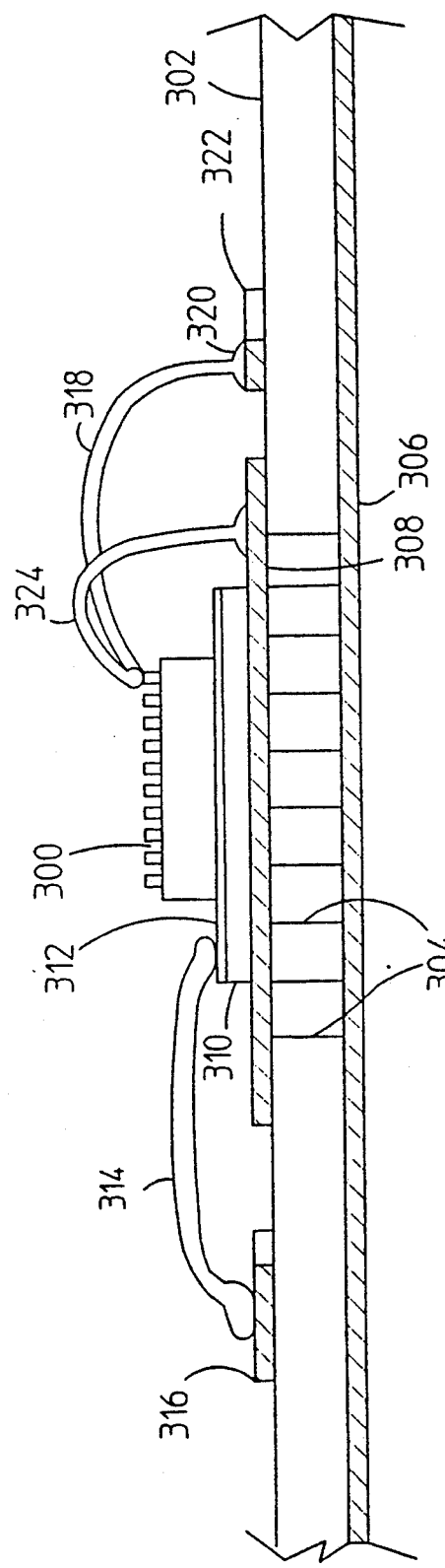
FIG. 4 is a mechanical cross section of the integrated circuit mounting and interconnection system illustrated in FIG. 3.

FIG. 3 illustrates a mechanical top view of the present invention. FIG. 4 illustrates a cross section through the system illustrated in FIG. 3. In FIGS. 3 and 4, an integrated circuit 300 is mounted to a substrate 302. The substrate 302 has a grid of vias 304 connecting a conductive lower ground plane 306 to a conductive upper ground plane 308. The integrated circuit 300 is electrically isolated from the upper ground plane 308 by a dielectric layer 310. The dielectric layer 310 has a conductive layer 312 which electrically contacts the back of integrated circuit 300. The conductive layer 312 has a bonding wire 314 to a back bias voltage 316 ($V_{EE}$). The integrated circuit 300 has a bonding wire 324 to the upper ground plane 308. The integrated circuit 300 has a bonding wire 318 to a signal trace 322. The integrated circuit 300 is attached to conductive layer 312 by a suitable high temperature adhesive. Likewise, dielectric layer 310 may be attached to the upper ground plane 308 with an adhesive.

In the preferred embodiment of the present invention, the substrate 302 is aluminum oxide. The vias 304 are preferably metal filled to maximize the thermal conductivity but alternatively may be just metal plated. If the vias 304 are solid filled then the dielectric 310 is preferably a screen printed glass ceramic. A suitable material is a .002 inch layer of insulating glass such as DuPont 5704M. If the vias 304 are merely plated, the ends of the vias are open and a screen printed dielectric cannot cover the open ends. Therefore, for plated vias, a mechanically rigid dielectric is needed. For plated vias, a thin sheet of thermally conductive substrate such as aluminum nitride or beryllium oxide is preferable. The rigid substrate must be thin for thermal transmission but thick enough to conveniently process. Aluminum nitride with a thickness in the range of .010–.025 inches is suitable.

In the preferred embodiment, the upper and lower ground planes (306 and 308) are Palladium-Silver. The vias 304 are plated with gold. The vias 304 are then filled with gold that contains a small amount of glass filler. The glass filler improves adhesion and also minimizes the thermal expansion mismatch between the gold and the surrounding substrate material.

In the preferred embodiment, the vias 304 are laser drilled using a $CO_2$ laser. The distance between vias 304 is approximately the same as the thickness of the substrate (302).

Figure 1:
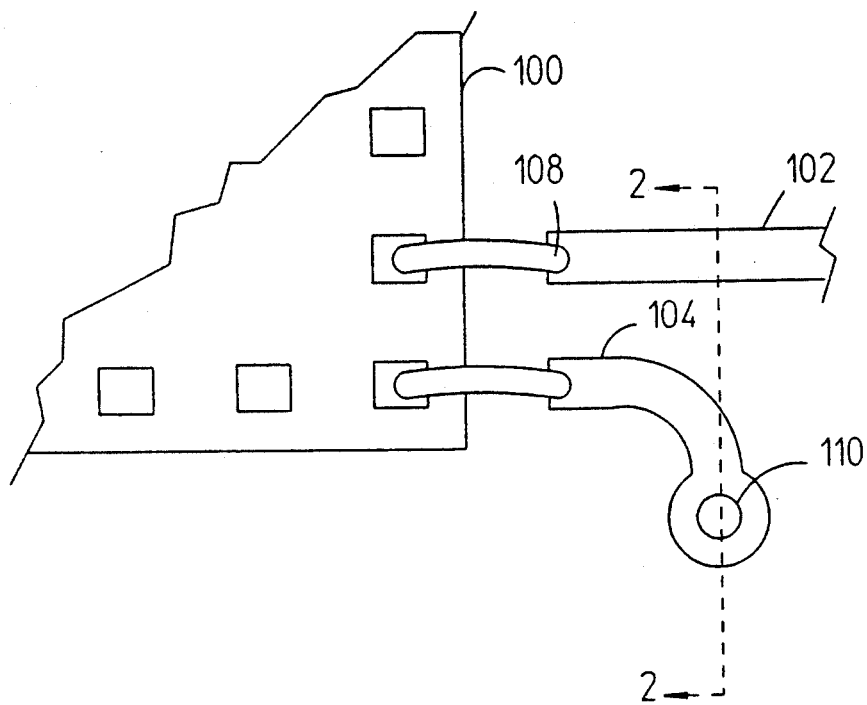
FIG. 1 (prior art) illustrates a mechanical top view of a portion of an integrated circuit wire bonded to a substrate.
Figure 2:
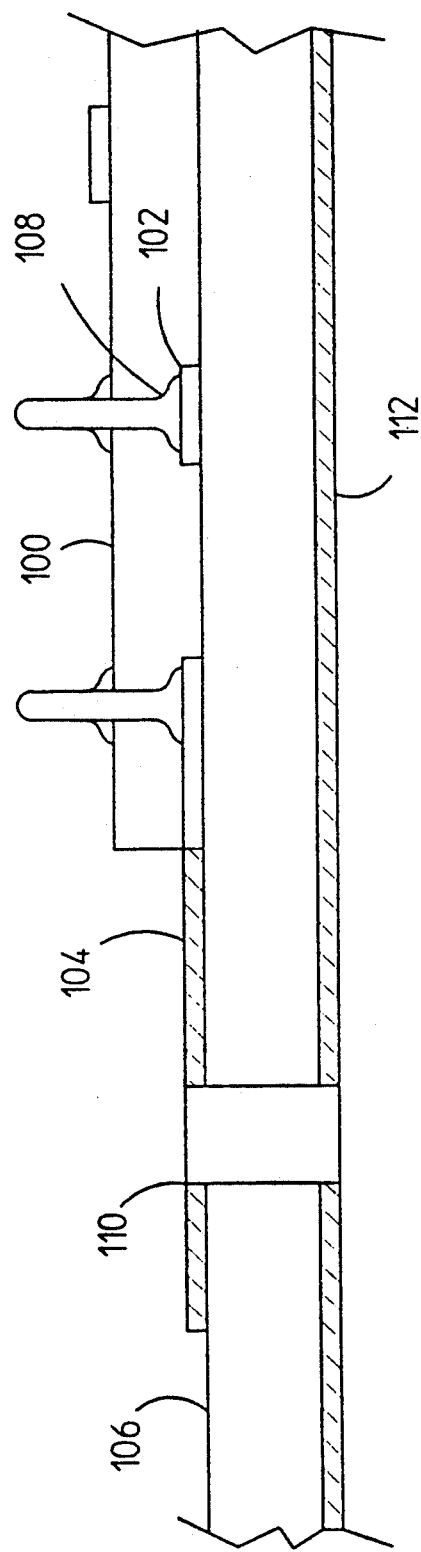
FIG. 2 (prior art) is a mechanical cross section of the integrated circuit assembly of FIG. 1.

FIGS. 3 and 4 also illustrate the improvement in transmission line geometry. The signal bond wire 318 has the upper ground plane 308 underneath for much of the distance to the integrated circuit 300, effectively forming a microstrip. In addition, the ground bond wire 324 provides a very short path from the same upper ground plane 308 to the integrated circuit. The grid of conductive vias 304 provides a very low impedance path between the upper and lower ground planes. While there is still some transmission line discontinuity at the signal bond 320, there is much less of a discontinuity than the prior art as illustrated in FIG. 1.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit packaging system comprising:
   an integrated circuit die having a back surface and having a plurality of bonding pads;
   a first plurality of wires for electrical ground and a second plurality of wires for electrical signals, wherein each wire from the first plurality of wires and the second plurality of wires is bonded to a corresponding pad in the plurality of bonding pads;
   a substrate having top and bottom surfaces;
   a bottom ground plane substantially covering the substrate bottom surface;
   a top ground plane, located on the substrate top surface;
   a plurality of vias passing through the substrate from the substrate top surface to the substrate bottom surface, the vias being electrically and thermally conductive, the vias thereby providing heat transfer from the substrate top surface to the substrate bottom surface and high frequency electrical conductivity from the top ground plane to the bottom ground plane;
   insulation means for insulating the back surface of the integrated circuit die from the top ground plane, the insulation means located between the back surface of the integrated circuit die and the top ground plane and the insulation means being attached to the back surface of the integrated circuit die and to the top ground plane; and,
   wherein the top ground plane extends beyond the bottom surface of the integrated circuit die, wherein each wire in the first plurality of wires is bonded to the top ground plane, thereby providing a short high frequency ground path for each wire in the first plurality of wires, and wherein each wire in the second plurality of wires passes near the top ground plane, thereby forming a separate microstrip by each wire in the second plurality of wires in conjunction with the top ground plane.

2. A packaging system as in claim 1 wherein the insulation means further comprises a layer of ceramic next to the top ground plane and an insulator conductive layer between the ceramic and the integrated circuit die.

3. A packaging system as in claim 2 further comprising:
   a bias voltage electrically connected to the insulator conductive layer.

4. A packaging system as in claim 3 wherein the conductive vias are filled with a metal.

5. A packaging system as in claim 1 wherein the insulation means further comprises a layer of glass ceramic next to the top ground plane and an insulator conductive layer between the glass ceramic layer and the integrated circuit die.

6. A packaging system as in claim 5 further comprising:
   a bias voltage electrically connected to the insulator conductive layer.

* * * * *